(12) United States Patent
Oh (10) Patent No.: US 9,773,559 B2
(45) Date of Patent: Sep. 26, 2017

(54) FLASH MEMORY DEVICE

(71) Applicant: SK hynix Inc., Icheon (KR)

(72) Inventor: Sung Lae Oh, Cheongju (KR)

(73) Assignee: SK HYNIX INC., Icheon (KR)

( * ) Notice: Subject to any disclaimer, the term of this patent is extended or adjusted under 35 U.S.C. 154(b) by 394 days.

(21) Appl. No.: 14/585,147

(22) Filed: Dec. 29, 2014

(65) Prior Publication Data

US 2016/0019968 A1    Jan. 21, 2016

(30) Foreign Application Priority Data

Jul. 21, 2014    (KR) ........................ 10-2014-0092139

(51) Int. Cl.
| | |
|---|---|
| G11C 7/10 | (2006.01) |
| G11C 16/10 | (2006.01) |
| G11C 8/10 | (2006.01) |
| G11C 7/06 | (2006.01) |

(52) U.S. Cl.
CPC ............ G11C 16/107 (2013.01); G11C 16/10 (2013.01); *G11C 7/06* (2013.01); *G11C 7/10* (2013.01); *G11C 8/10* (2013.01)

(58) Field of Classification Search
CPC ......... G11C 16/107; G11C 16/10; G11C 7/10; G11C 7/06; G11C 8/10

USPC ..................................................... 365/185.05
See application file for complete search history.

(56) References Cited

U.S. PATENT DOCUMENTS

| | | | |
|---|---|---|---|
| 2010/0103737 A1* | 4/2010 | Park .................... | G06F 11/1068 |
| | | | 365/185.09 |
| 2013/0141979 A1* | 6/2013 | Kim ...................... | G11C 16/26 |
| | | | 365/185.18 |
| 2017/0053681 A1* | 2/2017 | Kim ......................... | G11C 7/10 |

FOREIGN PATENT DOCUMENTS

| | | |
|---|---|---|
| KR | 10-2004-0009444 A | 1/2004 |
| KR | 10-2007-0109669 A | 11/2007 |
| KR | 10-2009-0098105 A | 9/2009 |

* cited by examiner

*Primary Examiner* — Han Yang
*Assistant Examiner* — Xiaochun L Chen (57) ABSTRACT

A flash memory device includes a first page buffer, a second page buffer neighboring the first page buffer, a source-pickup region disposed between the first page buffer and the second page buffer, and a source line extending in a direction. The source line includes a first portion that corresponds to the first page buffer and a second portion that corresponds to the second page buffer. A first resistance value of the first portion is substantially the same as a second resistance value of the second portion.

20 Claims, 6 Drawing Sheets

FLASH MEMORY DEVICE

CROSS-REFERENCE TO RELATED APPLICATION

The priority to Korean Patent Application No. 10-2014-0092139 filed on 21 Jul. 2014, which is hereby incorporated in its entirety by reference, is claimed.

BACKGROUND

Embodiments of the present disclosure relate to a flash memory device, and more particularly to a layout for a flash memory device.

A flash memory device, which is a kind of a memory device, includes a page buffer to program or read a large volume of data for a short period of time. The page buffer performs a programming operation or a read operation of the flash memory device in units of a page.

Figure 1:
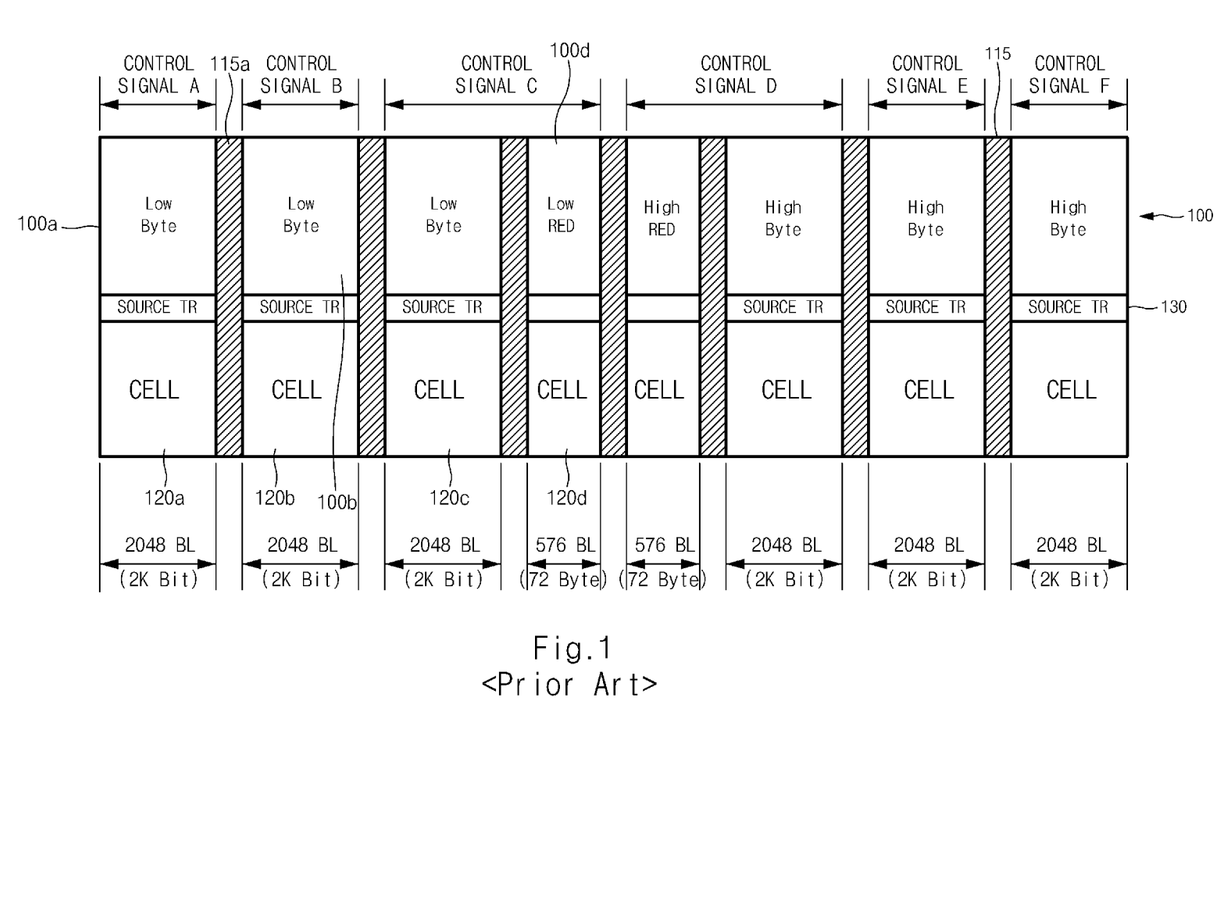
FIG. 1 illustrates a general semiconductor device.

FIG. 1 is a block diagram illustrating a general flash memory device.

Referring to FIG. 1, a general flash memory device includes a plurality of memory cell arrays 120, and a plurality of page buffers 100. Each of the memory cell arrays 120 includes a plurality of memory cells that store data.

Each memory cell array 120 also includes a plurality of bit lines and a plurality of word lines, and a corresponding page buffer 100 is arranged in a region neighboring the memory cell array 120. A source-pick-up region 115 is arranged between two neighboring page buffers 100 and between two neighboring memory cell arrays 120. That is, a first source-pick-up region 115a may extend along a first side of a first page buffer 100a and a first main memory cell array 120a corresponding to the first page buffer 100a and a second side of a second page buffer 100b and a second main memory cell array 120b corresponding to the second page buffer 100b.

Each of the page buffers 100 is coupled to a control signal. As shown in FIG. 1, the first page buffer 100a is coupled to a first control signal A, the second page buffer 100b is coupled to a second control signal B, and so on. Each control signal independently controls a page buffer 100 coupled to the control signal, and thus also controls a memory cell array 120 corresponding to the coupled page buffer 100. That is, each of the source-pick-up regions 115 is arranged to separate the memory cell arrays 120, which are controlled based on independent control signals, respectively.

The page buffers 100 are arranged on the basis of the number of bit lines. That is, the page buffers 100 are arranged such that each page buffer 100 coupled to a number of corresponding bit lines can process a predetermined amount of data. For example, as shown in FIG. 1, some page buffers 100 correspond to 2048 bit lines to process 2K bit data, while other page buffers 100 correspond to 576 bit lines to process 72 byte data (i.e., 72 byte*8 bits/byte=576 bit data). Since the number of bit lines (e.g., 2048 BLs) coupled to the first page buffer 100a and the first main memory cell array 120a is different from the number of bit lines (e.g., 576 BLs) coupled to a first low RED buffer 100d and a first RED cell array 120d, the source-pick-up regions 115 are arranged at irregular intervals.

A source transistor TR 130 is arranged between a memory cell array 120 and a corresponding page buffer 100. The source transistor TR 130 includes a plurality of gates. A source terminal located at one side of a gate is coupled to a source line, and a drain terminal located at one side of a gate is coupled to a ground voltage terminal.

As described above, the source-pick-up regions 115 are installed between two neighboring page buffers 100 and each of the page buffers 100 is coupled to a corresponding control signal. Thus, it is difficult to reduce the number of source-pick-up regions 115.

In addition, as described above, the source-pick-up regions 115 are arranged irregularly. Thus, when a source line crosses bit lines, a first length of the source line corresponding to a first page buffer 100a is different from a second length of the source line corresponding to a first RED page buffer 100d. Accordingly, the resistance value corresponding to the first length of the source line is different from the resistance value corresponding to the second length of the source line. That is, resistance values vary at different portions of the source line. Accordingly, a current difference caused by the irregular resistance values may occur.

BRIEF SUMMARY

Various embodiments of the present disclosure are directed to providing a flash memory device that addresses one or more problems of the related art.

Embodiments of the present disclosure relate to a flash memory device in which source-pick-up regions are arranged on the basis of a resistance value of a source line. Embodiments are also directed to reducing the number of source-pick-up regions, thereby resulting in the reduction of a chip size.

In accordance with an embodiment of the present disclosure, a flash memory device includes a first page buffer, a second page buffer arranged neighboring the first page buffer, a source-pick-up region disposed between the first page buffer and the second page buffer, and a source line extending in a direction and including a first portion that corresponds to the first page buffer and a second portion that corresponds to the second page buffer. The source-pick-up region is disposed between the first portion and the second portion. A first resistance value of the first portion is substantially the same as a second resistance value of the second portion.

In an embodiment, the flash memory device further comprises first and second memory cell arrays. The first memory cell array neighbors the first page buffer and the second memory cell array neighbors the second page buffer.

The source-pick-up region extends along a first side of the first page buffer and the first memory cell array.

The first and second memory cell arrays each include first and second pluralities of bit lines, respectively, and the first plurality of bit lines is coupled to the first page buffer and the second plurality of bit lines is coupled to the second page buffer.

The source line extends in the direction substantially perpendicular to the bit lines.

The source line is coupled to the source-pick-up region.

In an embodiment, the flash memory device further comprises first, second, and third control signal units. The first control signal unit controls a first portion of the first page buffer, the second control signal unit controls a second portion of the first page buffer and a first portion of the second page buffer, and the third control signal unit controls a second portion of the second page buffer.

In an embodiment, the flash memory device further comprises a source transistor unit disposed between the first memory cell array and the first page buffer.

The source transistor unit includes a plurality of gates, a plurality of source terminals, and a plurality of drain terminals, and a source terminal and a drain terminal are respectively disposed at one side and the other side of a corresponding one of the plurality of gates.

The source terminal is coupled to the source line, and the drain terminal is coupled to a ground voltage terminal.

The first and second memory cell arrays are coupled to the first and second page buffers through the first and second pluralities of bit lines, respectively.

In accordance with another embodiment of the present disclosure, a flash memory device comprises a first page buffer, a second page buffer neighboring the first page buffer, a source-pick-up region disposed between the first page buffer and the second page buffer, and first, second, and third control signal units configured to generate first, second, and third control signals, respectively. The first control signal unit controls a first portion of the first page buffer, the second control signal unit controls a second portion of the first page buffer and a first portion of the second page buffer, and the third control signal unit controls a second portion of the second page buffer.

The flash memory device further comprises a source line. The source line extends in a direction and includes a first portion that corresponds to the first page buffer and a second portion that corresponds to the second page buffer, and a first resistance value of the first portion is substantially the same as a second resistance value of the second portion.

The first portion of the source line has substantially the same length as the second portion of the source line.

A first plurality of bit lines is coupled to the first page buffer and a second plurality of bit lines is coupled to the second page buffer, and a number of the first plurality of bit lines is substantially the same as a number of the second plurality of bit lines.

The first number of the first plurality of bit lines is greater than 2048 bit lines.

In accordance with embodiments, since more than one control signal is coupled to a page buffer and source-pick-up regions are arranged between neighboring page buffers, the number of source-pick-up regions to be installed can be reduced, thereby resulting in reduction of a chip size.

In accordance with embodiments, the source-pick-up regions are arranged at regular intervals based on a unit resistance value of a source line. Since the unit resistance value of the source line corresponding to a length between neighboring source-pick-up regions is substantially the same, a current difference between the source lines can be reduced.

BRIEF DESCRIPTION OF THE DRAWINGS

FIGS. 3A to 3C are cross-sectional views illustrating the portion of the semiconductor device shown in FIG. 2B. In more detail.

DESCRIPTION OF EMBODIMENTS

Reference will now be made in detail to certain embodiments, examples of which are illustrated in the accompanying drawings. Wherever possible, the same reference numbers will be used throughout the drawings to refer to the same or like parts. In the following description, a detailed description of related known configurations or functions incorporated herein may be omitted.

Figure 2A:
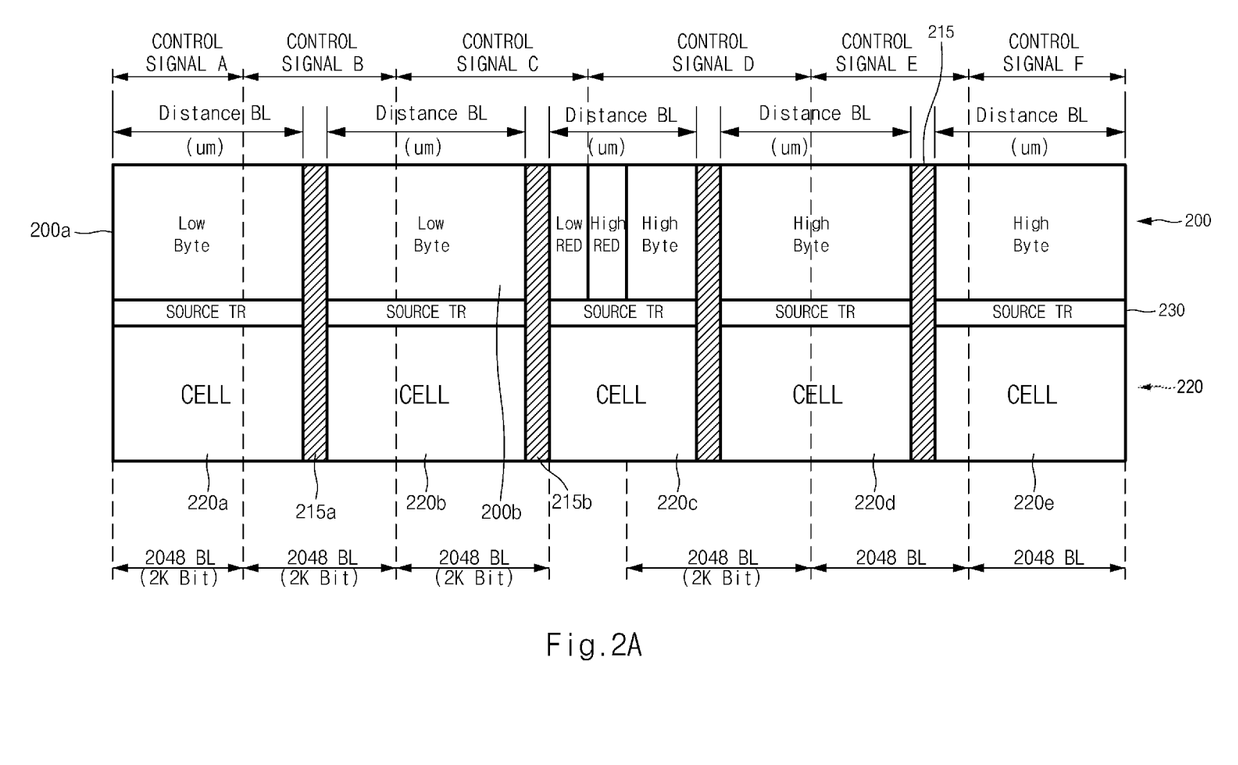
FIG. 2A illustrates a semiconductor device according to an embodiment of the present disclosure.
Figure 2B:
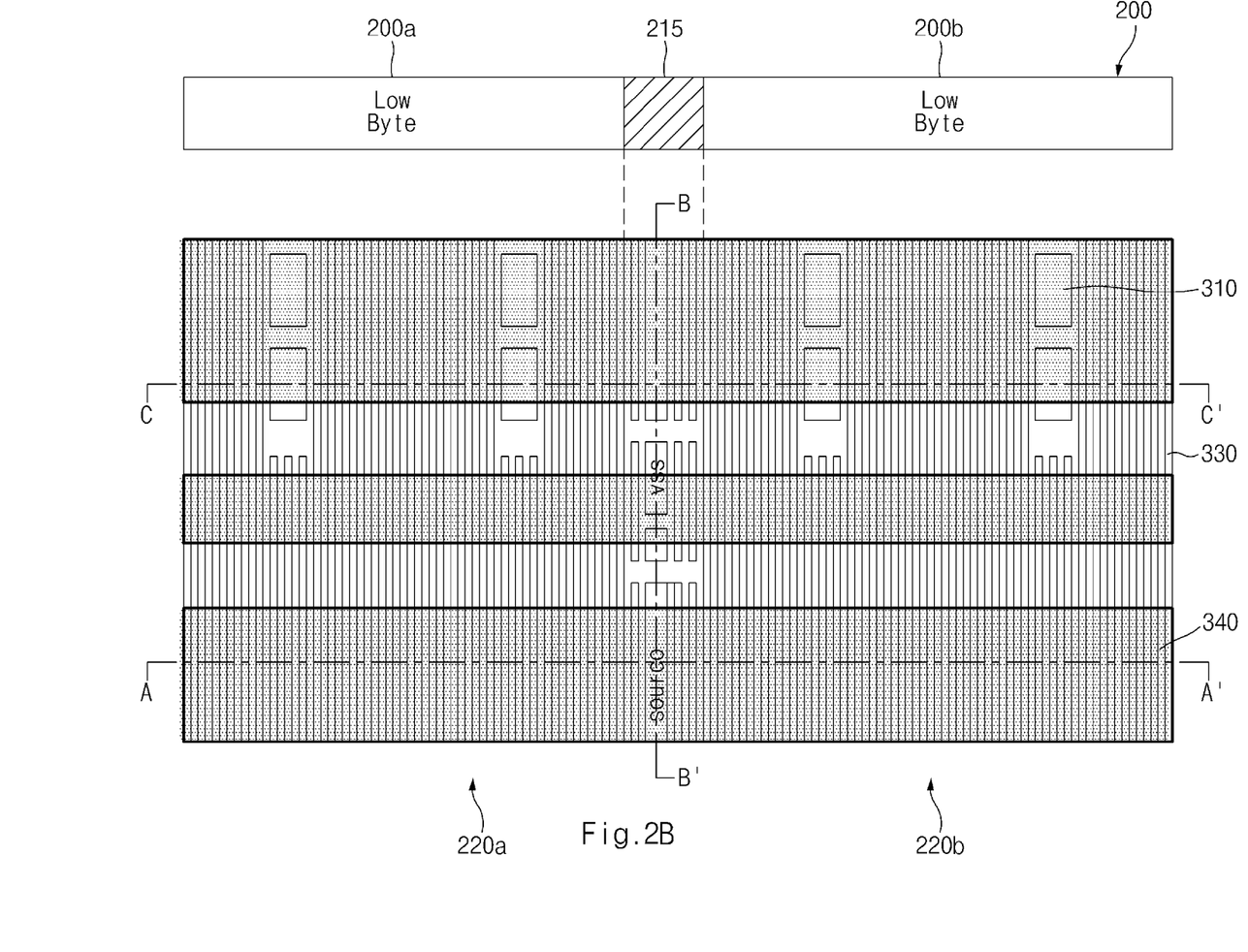
FIG. 2B is a plan view illustrating a portion of the semiconductor device shown in FIG. 2A.

FIGS. 2A and 2B are plan views illustrating a semiconductor device according to an embodiment of the present disclosure.

A flash memory device according to an embodiment includes a plurality of memory cell arrays 220 and a plurality of page buffers 200. Each of the memory cell arrays 220 includes a plurality of memory cells storing data therein.

The plurality of memory cells is arranged in a plurality of strings. The memory cell array 220 also includes a plurality of bit lines and a plurality of word lines. In an embodiment, each of the word lines may be coupled to a corresponding plurality of strings, and each of the strings may be electrically coupled to a page buffer 200. The page buffer 200 senses data in a cell array 220 through a pair of bit lines, one of which is classified as an even bit line while the other is classified as an odd bit line.

The page buffer 200 may receive a predetermined amount of data from an external element, store the received data therein for a short period of time, and then transmit the stored data to a corresponding memory cell.

Each page buffer 200 neighbors a memory cell array 220. In an embodiment, the page buffer 200 may be arranged at one side of the memory cell array 220, but embodiments are not limited thereto. In other embodiments, the page buffer 200 may be arranged at any two opposite sides of the memory cell array 220 or may be arranged in other configurations.

The page buffer 200 is coupled to a plurality of bit lines of the memory cell array 220. Each of a plurality of source-pick-up regions 215 is arranged between two neighboring page buffers 200. That is, a first source-pick-up region 215a may extend along a first side of a first page buffer 200a and a first main memory cell array 220a corresponding to the first page buffer 200a, and along a second side of a second page buffer 200b and a second main memory cell array 220b corresponding to the second page buffer 200b. In an embodiment, the position of source-pick-up regions 215 may be determined on the basis of a unit resistance value of a source line. In this disclosure, the term "unit resistance value" may be used to refer to a resistance value of a length of a source line that corresponds to one page buffer 200. For example, the first source-pick-up region 215a is arranged between the first and second memory arrays 220a and 220b, and the second source-pick-up region 215b is arranged between the second and third memory arrays 220b and 220c. A source line crossing the first and second main memory cell arrays 220a and 220b in a first direction (e.g., in a horizontal direction with respect to the orientation of FIG. 2A) has first and second portions corresponding to the first page buffer 200a and the second page buffer 200b, respectively, and the first and second portions of the source line have substantially the same unit resistance value. In an embodiment, the first direction is substantially perpendicular to a second direction along which a plurality of bit lines extends. In an embodiment, the first and second portions of the source line have substantially the same length Distance BL to have substantially the same unit resistance value.

In an embodiment, a control signal generated by a control signal circuit may be coupled to a number of bit lines in the same manner as described above with reference to FIG. 1. For example, a first control signal A and a second control signal B are each coupled to a predetermined number of bit lines (e.g., 2048 BLs). However, in an embodiment, more than one control signal may be coupled to a page buffer 200. For example, the first control signal A is coupled to a first portion of the first page buffer 200a, and the second control signal B is coupled to a second portion of the first page buffer 200a. Likewise, the second control signal B is also coupled to a first portion of the second page buffer 200b and a third control signal C is coupled to a second portion of the second page buffer 200b. That is, a single control signal may be coupled to more than one page buffer 200, and more than one control signal may be coupled to a single page buffer.

As described above with reference to FIG. 1, in a general semiconductor device, the source-pick-up regions 115 are arranged between two neighboring page buffers 100 and each of the page buffers 100 is coupled to a corresponding control signal. Thus, since the number of the source-pick-up regions is fixed based on the number of the control signals, it is difficult to reduce the number of source-pick-up regions. However, according to an embodiment of the present disclosure, since more than one control signal may be coupled to a page buffer, when source-pick-up regions are arranged between neighboring page buffers, the number of source-pick-up regions to be installed can be smaller than in a general semiconductor device, thereby reducing the chip size. That is, the source-pick-up regions in an embodiment may be spaced apart from each other by a greater distance than in a general device.

In addition, since a unit resistance value of a source line corresponding to the distance between the source-pick-up regions becomes substantially uniform or constant, a current difference between the source lines can be reduced or prevented.

First and second main memory cell arrays 220a and 220b and first and second page buffers 200a and 200b in accordance with an embodiment will hereinafter be described with reference to FIGS. 3 and 3A to 3C.

Referring to FIG. 2B, each of the cell arrays 220a and 220b includes a plurality of bit lines 330, and page buffers 200a and 200b neighbor a corresponding cell array 220a and 220b, respectively. A source-pick-up region 215 is arranged between neighboring page buffers 200a and 200b, and the source-pick-up region 215 may be arranged on the basis of a unit resistance value corresponding to one page buffer 200.

Figure 3A:
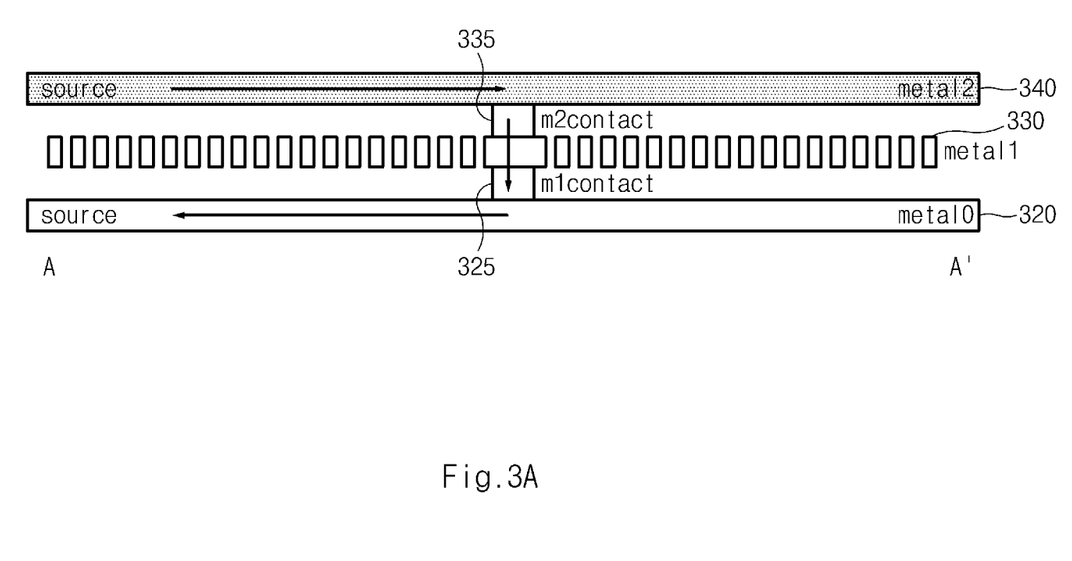
FIG. 3A is a cross-sectional view taken along a line A-A' of FIG. 2B.
Figure 3B:
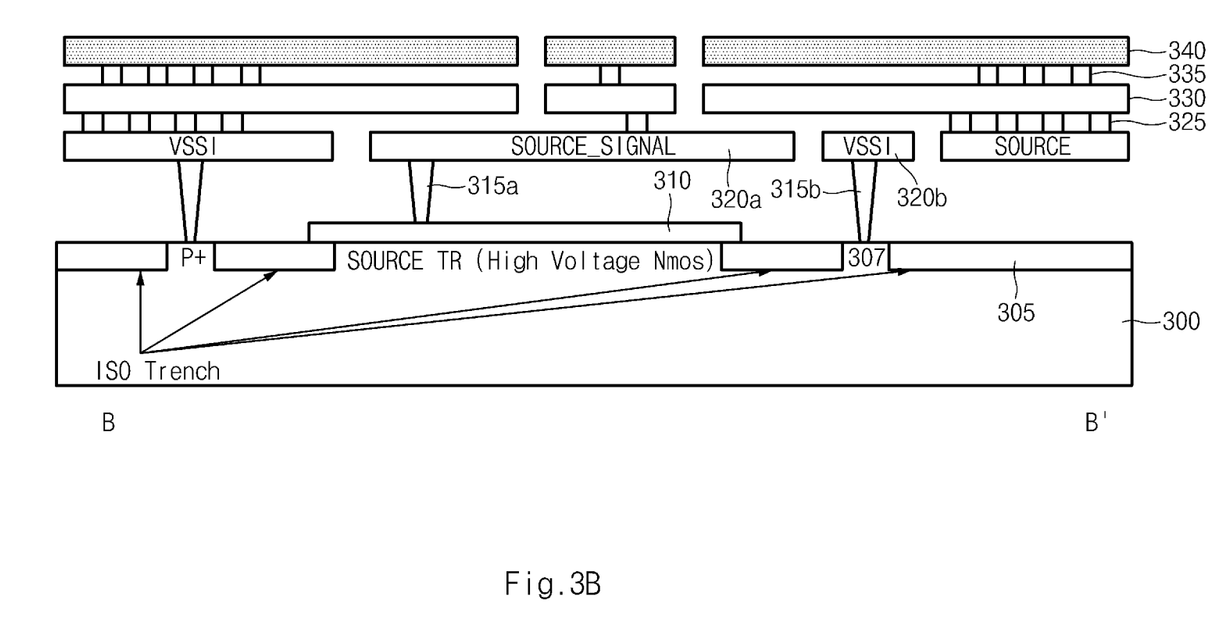
FIG. 3B is a cross-sectional view taken along a line B-B' of FIG. 2B.
Figure 3C:
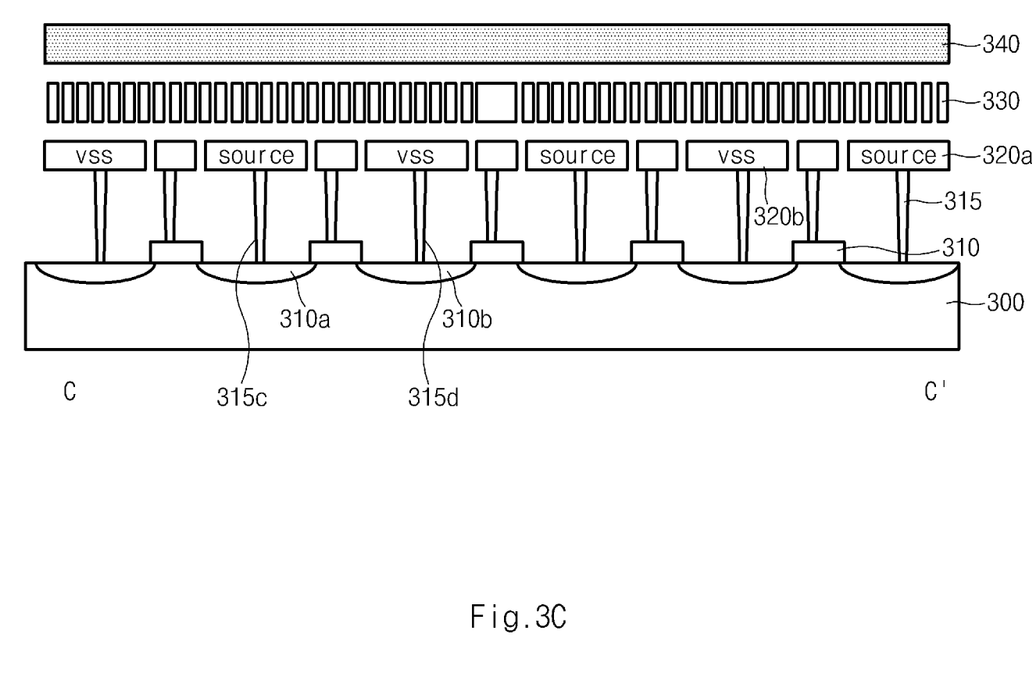
FIG. 3C is a cross-sectional view taken along a line C-C' of FIG. 2B.

FIG. 3A is a cross-sectional view illustrating a semiconductor device taken along line A-A' of FIG. 2B, FIG. 3B is a cross-sectional view illustrating a semiconductor device taken along line B-B' of FIG. 2B, and FIG. 3C is a cross-sectional view illustrating a semiconductor device taken along line C-C' of FIG. 2B.

Referring to FIG. 3A, a first metal line layer 320 is disposed over a semiconductor substrate (not shown), and a first contact 325 is disposed over the first metal line layer 320. In an embodiment, the first metal line layer 320 may be a source-pick-up unit. A second metal line layer 330 is coupled to the first contact 325. The second metal line layer 330 may include a plurality of bit lines.

A second contact 335 is disposed over the second metal line layer 330, and a third metal line layer 340 is coupled to the second contact 335. The third metal line layer 340 may include a plurality of source lines.

Referring to FIG. 3B, a source transistor 310 is disposed over a semiconductor substrate 300. A device isolation film 305 is disposed over the substrate 300. A third contact 315a is coupled to the source transistor 310 and a fourth contact 315b is coupled to an active region 307.

A source signal line 320a is coupled to the third contact 315a and a Vss signal line 320b is coupled to the second contact 315b. The source signal line 320a and the Vss signal line 320b may be in a line pattern. In an embodiment, the line pattern includes a plurality of source signal lines 320a and a plurality of Vss signal lines 320b, which are spaced apart from each other by a predetermined distance and alternating with each other.

A plurality of the first contacts 325 is coupled to the source signal line 320a and the Vss signal line 320b. In addition, a bit line of the second metal line layer 330 is disposed over and coupled to corresponding first contacts 325.

A plurality of second contacts 335 is disposed over the bit line 330, and a metal line 340 is disposed over and coupled to the second contacts 335.

Referring to FIG. 3C, a source transistor 310 is disposed over the semiconductor substrate 300, and source/drain regions 310a and 310b are disposed at both sides of the source transistor 310. Fifth and sixth contacts 315c and 315d are disposed over the source/drain regions 310a and 310b, and the first metal line layer 320 is coupled to the fifth and sixth contacts 315c and 315d.

The first metal line layer 320 acting as a source-pick-up unit may include a source signal line 320a and a Vss signal line 320b. The source region 310a is coupled to the source signal line 320a through the fifth contact 315c, and the drain region 310b is coupled to the Vss signal line 320b through the sixth contact 315d. The second metal line layer 330 and the third metal line layer 340 are disposed over the first metal line layer 320.

Referring back to FIG. 2A, a source transistor unit 230 is arranged between a page buffer 200 and the corresponding memory cell array 220.

The source transistor unit 230 may be turned on or off according to an operation mode of the memory cell array 220 of a non-volatile memory device. In other words, if the memory cell array 220 is performing a programming or read operation, the source transistor 230 is turned on to cause a current to flow in a forward direction. If the memory cell array 220 is performing an erasing operation, the source transistor 230 is turned off so that the current does not flow. The source transistor unit 230 includes a plurality of gates, a plurality of source terminals, and a plurality of drain terminals. A source terminal is arranged at one side of a corresponding gate, and a drain terminal is arranged at the other side of the corresponding gate. The source terminal of the source transistor unit 230 is coupled to a source line of the memory cell array, and the drain terminal of the source transistor unit 230 is coupled to a ground (GND) voltage terminal.

As described above, according to embodiments of the present disclosure, source-pick-up regions are arranged according to a unit resistance value of a source line. As a result, since more than one of control signals are coupled to a page buffer and the source-pick-up regions are arranged between neighboring page buffers, the number of source-pick-up regions to be installed can be reduced, thereby resulting in reduction of a chip size.

In addition, the source-pick-up regions are arranged at regular intervals of unit resistance value of the source line. Since the unit resistance values of the source line, which correspond to lengths between neighboring source-pick-up sections, are substantially the same, a current difference between the source lines can be reduced or prevented.

Those skilled in the art will appreciate that embodiments of the present disclosure may be carried out in other ways than those set forth herein without departing from the spirit and essential characteristics of these embodiments. The above embodiments are therefore to be construed in all aspects as illustrative and not restrictive.

Various alternatives and equivalents are possible. Embodiments are not limited by the type of deposition, etching polishing, and patterning steps described herein. Nor are embodiments limited to any specific type of semiconductor device. For example, embodiments may be implemented in a volatile memory device, such as a dynamic random access memory (DRAM) device, or a non-volatile memory device. Other additions, subtractions, or modifications are obvious in view of the present disclosure and are intended to fall within the scope of the appended claims.

What is claimed is:

1. A flash memory device comprising:
   a first page buffer having a first length in a direction;
   a second page buffer having a second length in the direction and neighboring the first page buffer in the direction;
   a source-pick-up region disposed between the first page buffer and the second page buffer; and
   a source line extending in the direction and including a first portion that corresponds to the first length of the first page buffer in the direction and a second portion that corresponds to the second length of the second page buffer in the direction, the source-pick-up region being disposed between the first portion and the second portion,
   wherein a first resistance value of the first portion is substantially the same as a second resistance value of the second portion.

2. The flash memory device according to claim 1, further comprising first and second memory cell arrays,
   wherein the first memory cell array neighbors the first page buffer and the second memory cell array neighbors the second page buffer.

3. The flash memory device according to claim 2, wherein the source-pick-up region extends along a first side of the first page buffer and the first memory cell array.

4. The flash memory device according to claim 2, wherein the first and second memory cell arrays each include first and second pluralities of bit lines, respectively, and
   wherein the first plurality of bit lines is coupled to the first page buffer and the second plurality of bit lines is coupled to the second page buffer.

5. The flash memory device according to claim 4, wherein the source line extends in the direction substantially perpendicular to the bit lines.

6. The flash memory device according to claim 5, wherein the source line is coupled to the source-pick-up region.

7. The flash memory device according to claim 1, further comprising first, second, and third control signal units,
   wherein the first control signal unit controls a first portion of the first page buffer, the second control signal unit controls a second portion of the first page buffer and a first portion of the second page buffer, and the third control signal unit controls a second portion of the second page buffer.

8. The flash memory device according to claim 2, further comprising:
   a source transistor unit disposed between the first memory cell array and the first page buffer.

9. The flash memory device according to claim 8, wherein the source transistor unit includes a plurality of gates, a plurality of source terminals, and a plurality of drain terminals, and
   wherein a source terminal and a drain terminal are respectively disposed at one side and the other side of a corresponding one of the plurality of gates.

10. The flash memory device according to claim 9, wherein the source terminal is coupled to the source line, and the drain terminal is coupled to a ground voltage terminal.

11. The flash memory device according to claim 4, wherein the first and second memory cell arrays are coupled to the first and second page buffers through the first and second pluralities of bit lines, respectively.

12. The flash memory device according to claim 1, wherein the first length is the substantially entire length of the first page buffer in the direction, and the second length is the substantially entire length of the second page buffer in the direction, and
   wherein a length of the first portion in the direction is substantially equal to the first length and a length of the second portion in the direction is substantially equal to the second length.

13. The flash memory device according to claim 1, wherein a plurality of source-pick-up regions include the source-pick-up region, adjacent source-pick-up regions of the plurality of source-pick-up regions being arranged at a regular interval.

14. The flash memory device according to claim 1, wherein each of the first and second page buffers is coupled to two or more control signals.

15. A flash memory device comprising:
   a first page buffer;
   a second page buffer neighboring the first page buffer;
   a source-pick-up region disposed between the first page buffer and the second page buffer; and
   first, second, and third control signal units configured to generate first, second, and third control signals, respectively,
   wherein the first control signal unit controls a first portion of the first page buffer, the second control signal unit controls a second portion of the first page buffer and a first portion of the second page buffer, and the third control signal unit controls a second portion of the second page buffer.

16. The flash memory device according to claim 15, further comprising a source line,
   wherein the source line extends in a direction and includes a first portion that corresponds to the first page buffer and a second portion that corresponds to the second page buffer, and
   wherein a first resistance value of the first portion is substantially the same as a second resistance value of the second portion.

17. The flash memory device according to claim 16, wherein the first portion of the source line has substantially the same length as the second portion of the source line.

18. The flash memory device according to claim 16, wherein a first plurality of bit lines is coupled to the first page buffer and a second plurality of bit lines is coupled to the second page buffer, and
   wherein a number of the first plurality of bit lines is substantially the same as a number of the second plurality of bit lines.

19. The flash memory device according to claim 18, wherein the first number of the first plurality of bit lines is greater than 2048 bit lines.

20. A flash memory device comprising:
   a first page buffer;
   a second page buffer neighboring the first page buffer;

a source-pick-up region disposed between the first page buffer and the second page buffer;

a source line extending in a direction and including a first portion that corresponds to the first page buffer and a second portion that corresponds to the second page buffer, the source-pick-up region being disposed between the first portion and the second portion; and first, second, and third control signal units, the first control signal unit controlling a first portion of the first page buffer, the second control signal unit controlling a second portion of the first page buffer and a first portion of the second page buffer, and the third control signal unit controlling a second portion of the second page buffer, wherein a first resistance value of the first portion is substantially the same as a second resistance value of the second portion.

* * * * *